(12) United States Patent (10) Patent No.: US 8,695,145 B2
Yoshimizu et al. (45) Date of Patent: Apr. 15, 2014

(54) CLEANING METHOD, CLEANING APPARATUS

(75) Inventors: Yasuhito Yoshimizu, Yokohama (JP); Hisashi Okuchi, Yokohama (JP); Hiroshi Tomita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 146 days.

(21) Appl. No.: 13/422,771

(22) Filed: Mar. 16, 2012

(65) Prior Publication Data

US 2013/0037055 A1 Feb. 14, 2013

(30) Foreign Application Priority Data

Aug. 11, 2011 (JP) ................................ P2011-175602

(51) Int. Cl.
*B08B 11/00* (2006.01)
*H01L 21/304* (2006.01)

(52) U.S. Cl.
USPC .................................. 15/77; 15/88.3; 15/102

(58) Field of Classification Search
USPC .................................. 15/77, 88.3, 88.4, 102
See application file for complete search history.

(56) References Cited

U.S. PATENT DOCUMENTS

| 5,893,381 | A | * | 4/1999 | Terui ................................. 134/6 |
| 6,261,377 | B1 | * | 7/2001 | Mertens et al. .................. 134/6 |
| 2009/0255558 | A1 | | 10/2009 | Inukai et al. |
| 2010/0230054 | A1 | | 9/2010 | Sugawara et al. |
| 2011/0061684 | A1 | | 3/2011 | Tomita et al. |
| 2012/0024317 | A1 | | 2/2012 | Kitamura et al. |

FOREIGN PATENT DOCUMENTS

JP 10-256207 9/1998

* cited by examiner

*Primary Examiner* — Randall Chin
(74) *Attorney, Agent, or Firm* — Finnegan, Henderson, Farabow, Garrett & Dunner, L.L.P.

(57) ABSTRACT

Transferring plural semiconductor substrates under a state being held with predetermined intervals; holding the plural semiconductor substrates with roll brushes provided in plural pieces by each front side and back side of the plural semiconductor substrates, longitudinal directions of the roll brushes being oriented in parallel relative to the front side and the back side; and cleaning the plural semiconductor substrates by rotating the plural roll brushes.

13 Claims, 14 Drawing Sheets

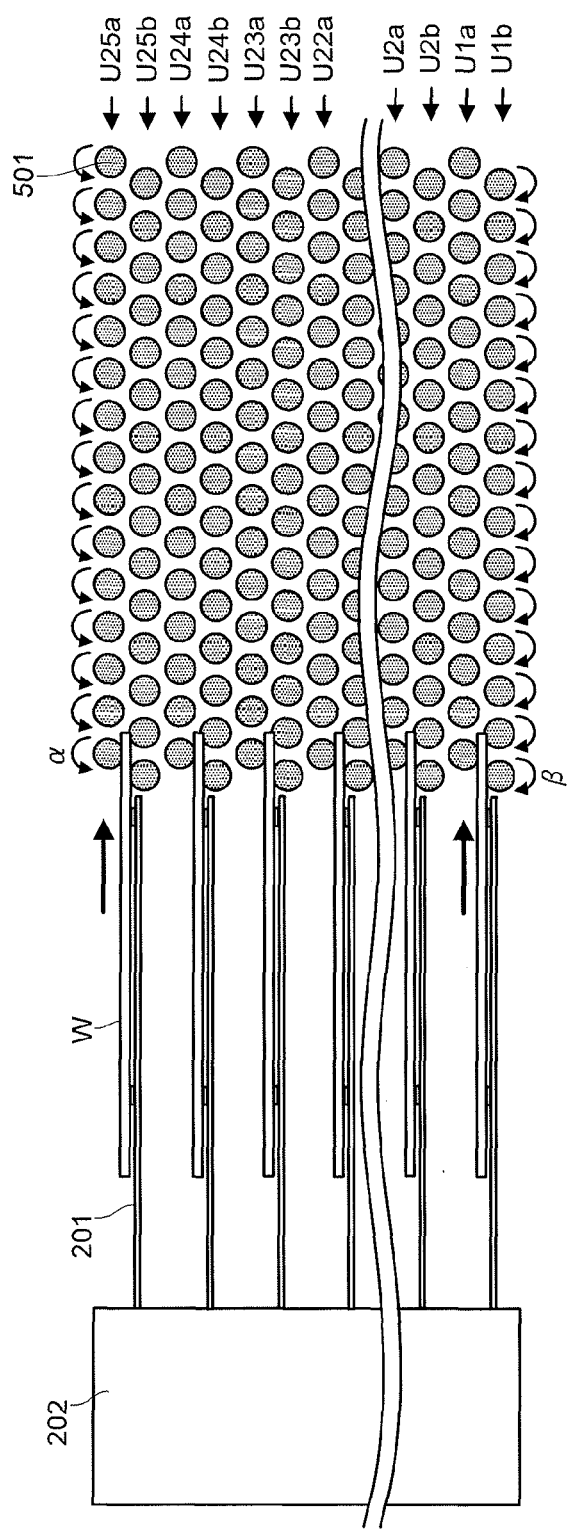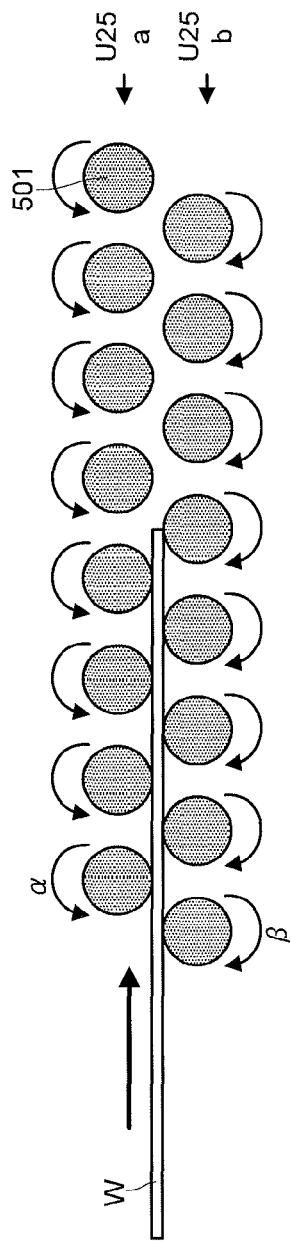

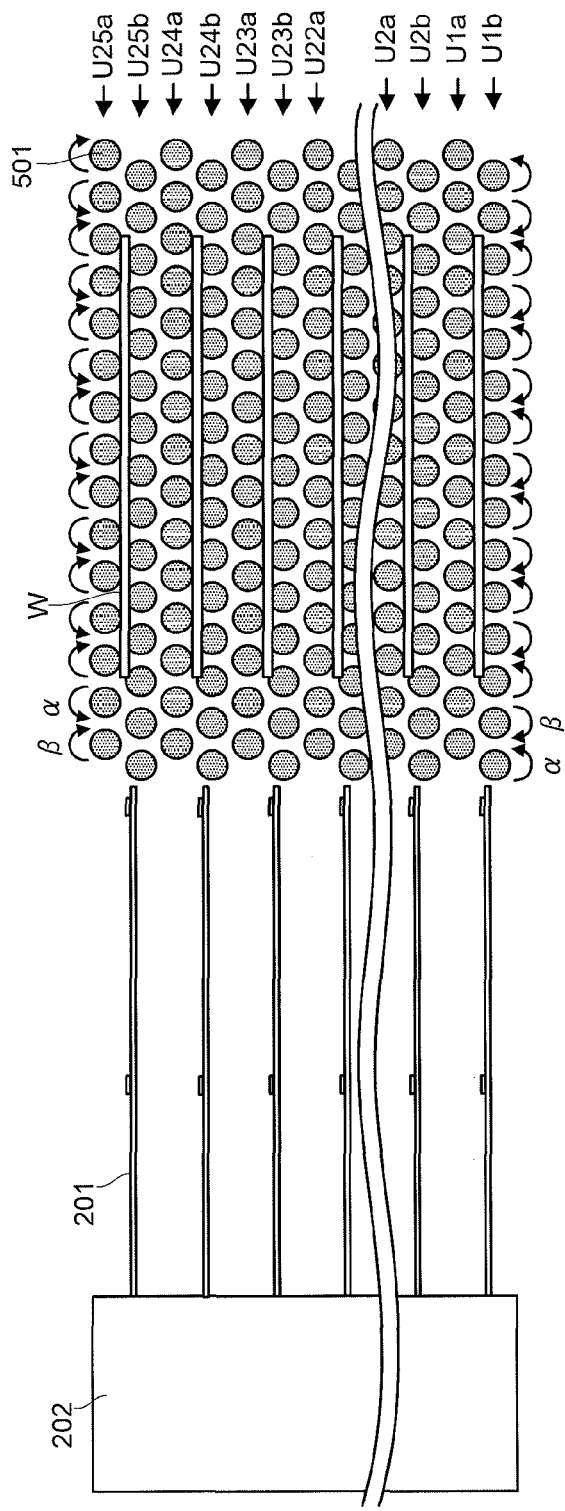
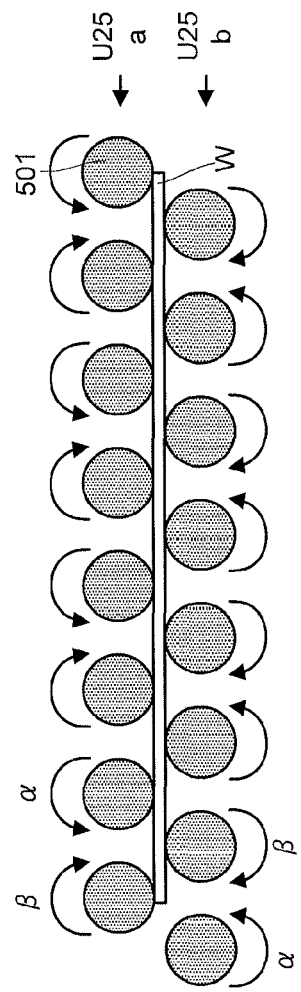

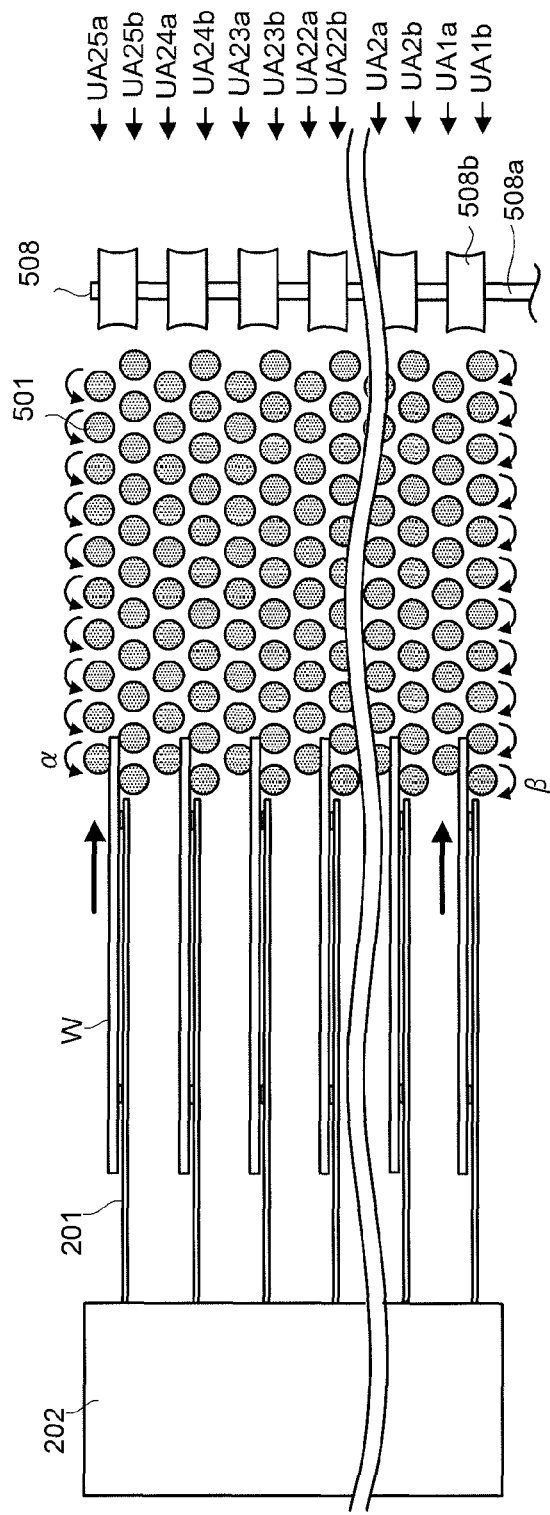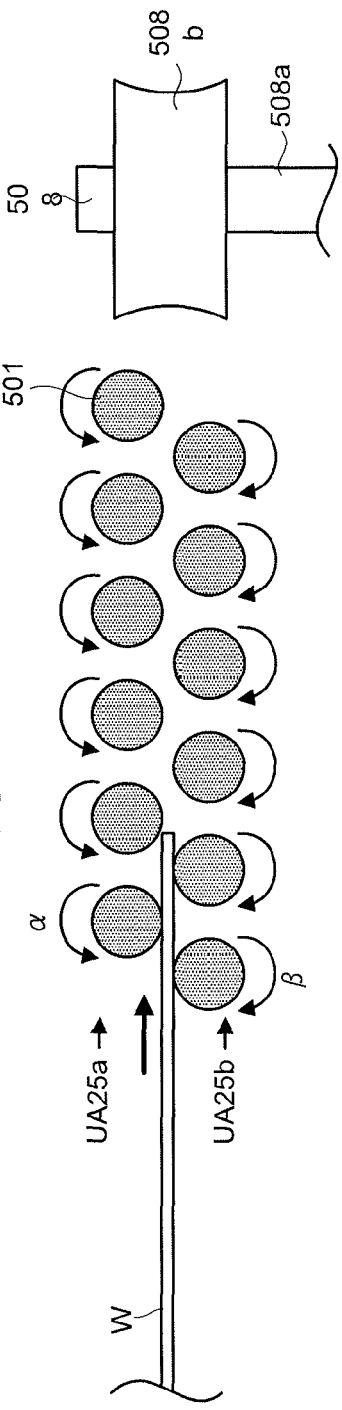

CLEANING METHOD, CLEANING APPARATUS

CROSS-REFERENCE TO RELATED APPLICATION

This application is based upon and claims the benefit of priority from the prior Japanese Patent Application No. 2011-175602, filed on Aug. 11, 2011; the entire contents of which are incorporated herein by reference.

FIELD

Embodiments described herein relate generally to a cleaning method and a cleaning apparatus of a semiconductor substrate.

BACKGROUND

Various methods are proposed for cleaning of a semiconductor substrate (hereinafter, referred to as a wafer). For example, a cleaning method using a brush, a cleaning method using an ultrasonic wave, a cleaning method spraying a cleaning liquid, and so on are cited. A particle removal capability of the cleaning method using the brush is the most excellent among those cleaning methods. There are a single-wafer-type cleaning the wafers one by one and a batch-type cleaning plural wafers at one time in the cleaning method using the brush.

In general, there is a tendency in which the particle removal capability is higher in the single-wafer-type cleaning method cleaning the wafers one by one than the batch-type cleaning method cleaning the plural wafers at one time. Accordingly, an apparatus using the single-wafer-type cleaning the wafers one by one is major in a conventional brush cleaning apparatus.

However, the wafers are cleaned one by one, in addition, a front side and a back side of the wafer are cleaned one by one with the brush in the single-wafer-type cleaning apparatus, and therefore, the number of wafers capable of being cleaned per unit time is small. Accordingly, there is an apparatus using the batch-type cleaning the plural wafers at one time in the conventional brush cleaning apparatus.

BRIEF DESCRIPTION OF THE DRAWINGS

FIG. 6A and FIG. 6B are explanatory diagrams of delivery of the wafers of the cleaning apparatus according to the first embodiment.

FIG. 7A and FIG. 7B are explanatory diagrams of cleaning of the wafers of the cleaning apparatus according to the first embodiment.

FIG. 11A and FIG. 11B are explanatory diagrams of delivery of wafers of a cleaning apparatus according to the second embodiment.

DETAILED DESCRIPTION

Hereinafter, embodiments are described with reference to the drawings. A cleaning apparatus according to the embodiment is a batch-type brush cleaning apparatus in which plural roll brushes are rotated under a state of being in contact with each front side and back side of plural semiconductor substrates W (hereinafter, described as wafers W), to clean the plural wafers W at one time. The apparatus have a transfer unit transferring plural semiconductor substrates under a state, the plural semiconductor substrates being held with predetermined intervals; roll brushes provided in plural pieces by each front side and back side of the plural semiconductor substrates, longitudinal directions of the roll brushes being oriented in parallel relative to the front side and the back side; and a driving unit rotating the plural roll brushes provided by each front side and back side.

First Embodiment

Figure 1A:
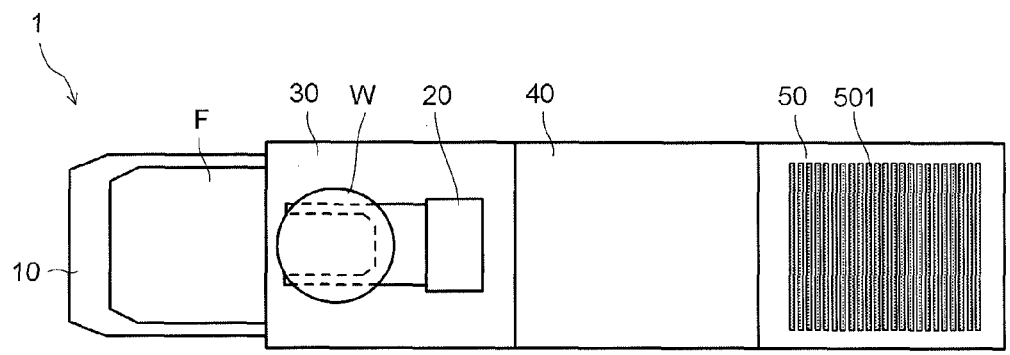
FIG. 1A and FIG. 1B are configuration charts of a cleaning apparatus according to a first embodiment.
Figure 1B:
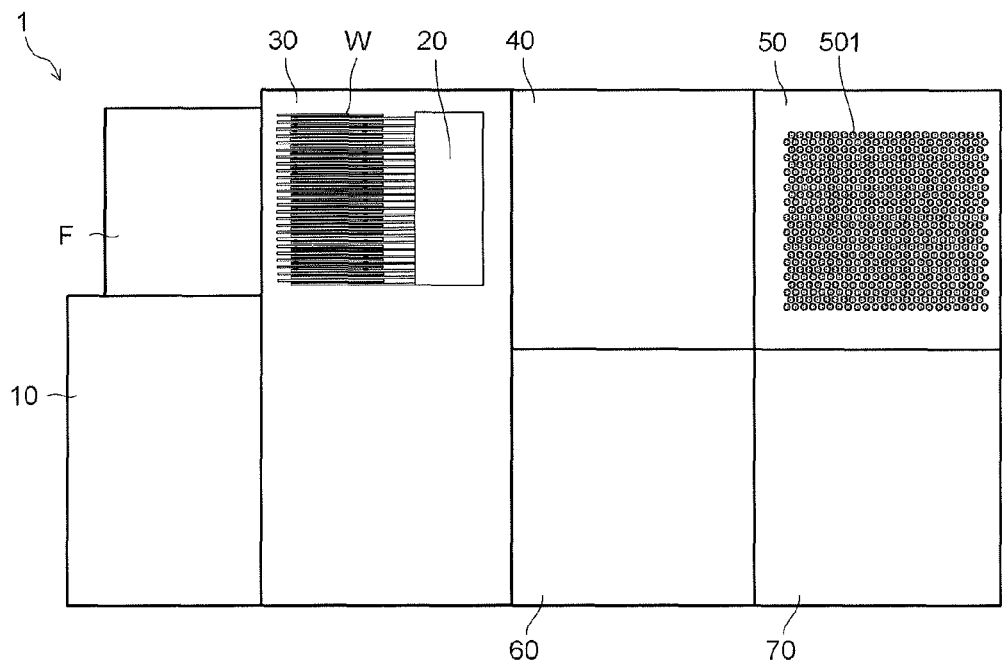

FIG. 1A and FIG. 1B are configuration charts of a cleaning apparatus 1 according to a first embodiment. FIG. 1A is a plan view of the cleaning apparatus 1. FIG. 1B is a right side view of the cleaning apparatus 1. Hereinafter, a configuration of the cleaning apparatus 1 is described with reference to FIGS. 1A, 1B and FIGS. 2A, 2B.

(Configuration of Cleaning Apparatus 1)

The cleaning apparatus 1 includes a load port 10, a transfer mechanism 20 (handler), a first delivery chamber 30, a second delivery chamber 40, a cleaning chamber 50, a drying chamber 60, and a waste water treatment chamber 70. The load port 10 opens and closes a lid of a container F such as an FOUP (Front Opening Unified Pod), an SMIF (Standard of Mechanical Interface) where plural wafers W (generally 25 wafers) are housed.

The first delivery chamber 30 is a chamber (space) to deliver the wafers W between the container F set at the load port 10 and the transfer mechanism 20. The second delivery chamber 40 is a chamber (space) to deliver the wafers W between the cleaning chamber 50 and the transfer mechanism 20. The transfer mechanism 20 moves among the first delivery chamber 30, the second delivery chamber 40, and the drying chamber 60 to transfer the wafers W housed in the container F to the cleaning chamber 50 and the drying chamber 60.

At the cleaning chamber 50, the plural wafers W transferred by the transfer mechanism 20 are cleaned at one time. The wafers W cleaned at the cleaning chamber 50 are transferred to the drying chamber 60 by the transfer mechanism 20. At the drying chamber 60, the wafers W cleaned at the cleaning chamber 50 are dried. The wafers W are dried at the drying chamber 60, and thereafter, housed in the container F set at the load port 10 by the transfer mechanism 20.

Figure 2A:
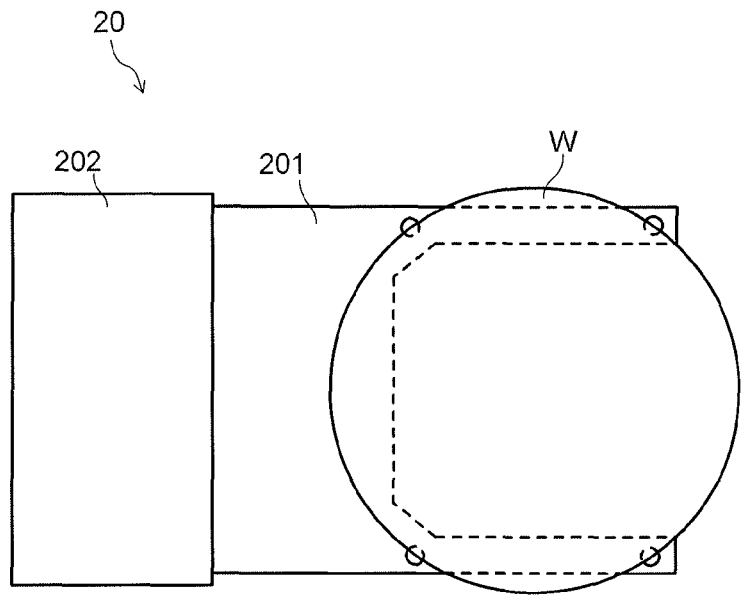
FIG. 2A and FIG. 2B are configuration charts of a transfer mechanism according to the first embodiment.
Figure 2B:
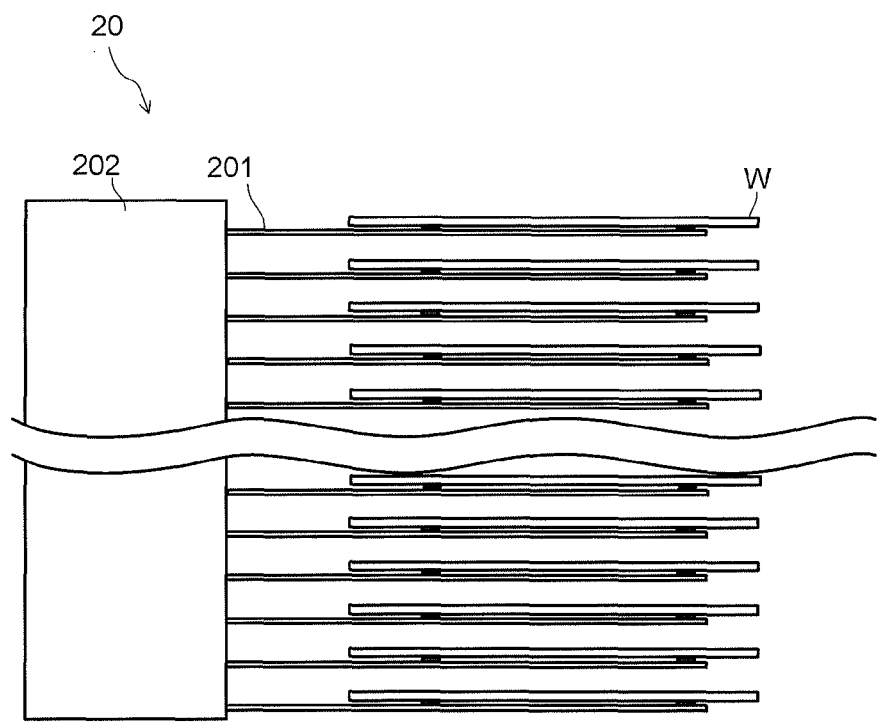

FIG. 2A and FIG. 2B are configuration charts of the transfer mechanism 20. FIG. 2A is a plan view of the transfer mechanism 20. FIG. 2B is a side view of the transfer mechanism 20. The transfer mechanism 20 includes 25 pieces of blades 201 to place the wafers W thereon, and a supporting member 202 to support the 25 pieces of blades 201. The supporting member 202 is coupled to a driving mechanism (not-illustrated), and moves among the first delivery chamber 30, the second delivery chamber 40, and the drying chamber 60. The number of pieces of the blades 201 is not limited to 25.

Figure 3A:
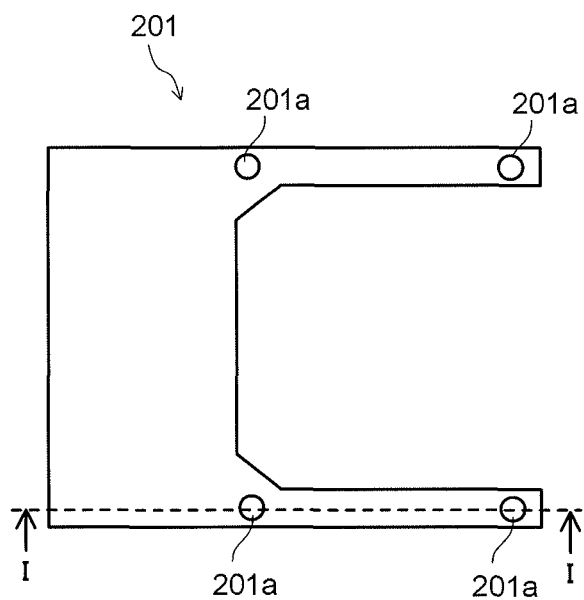
FIG. 3A and FIG. 3B are configuration charts of a blade according to the first embodiment.
Figure 3B:
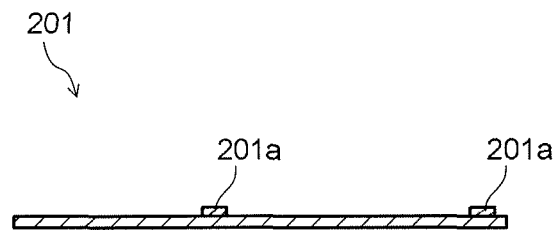

FIG. 3A and FIG. 3B are configuration charts of the blade 201. FIG. 3A is a plan view of the blade 201. FIG. 3B is a sectional view at a line I-I in FIG. 3A. Hereinafter, a configuration of the blade 201 is described with reference to FIG. 3A and FIG. 3B.

Projections 201a (hereinafter, described as rest pins 201a) to place the wafer W thereon are provided at each blade 201. The wafer W is placed on the rest pins 201a.

Figure 4A:
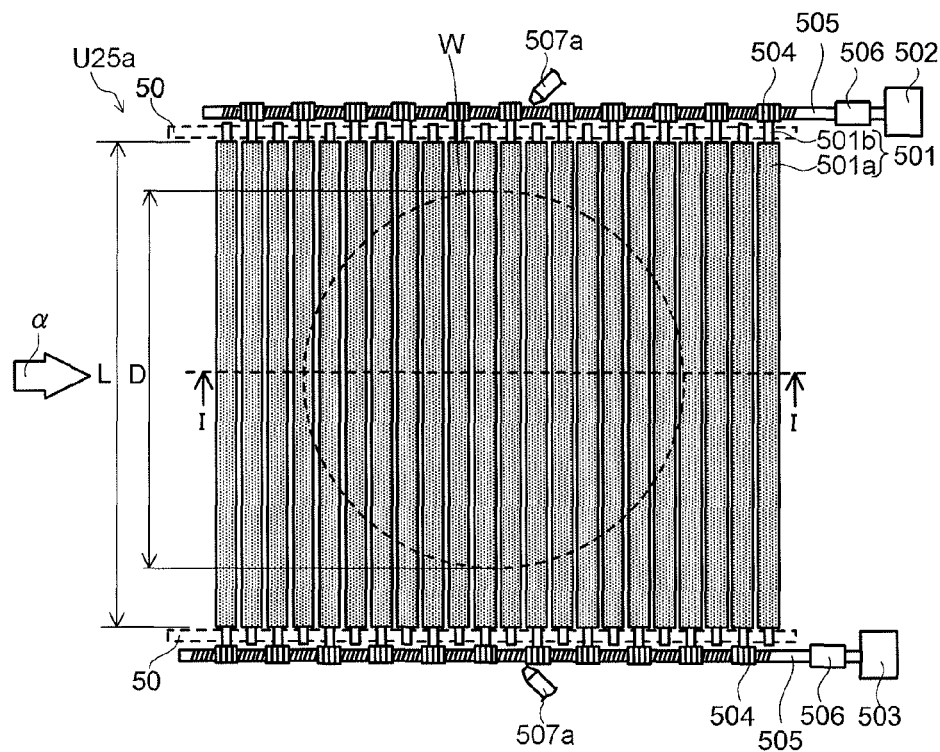
FIG. 4A and FIG. 4B are configuration charts of cleaning units according to the first embodiment.
Figure 4B:
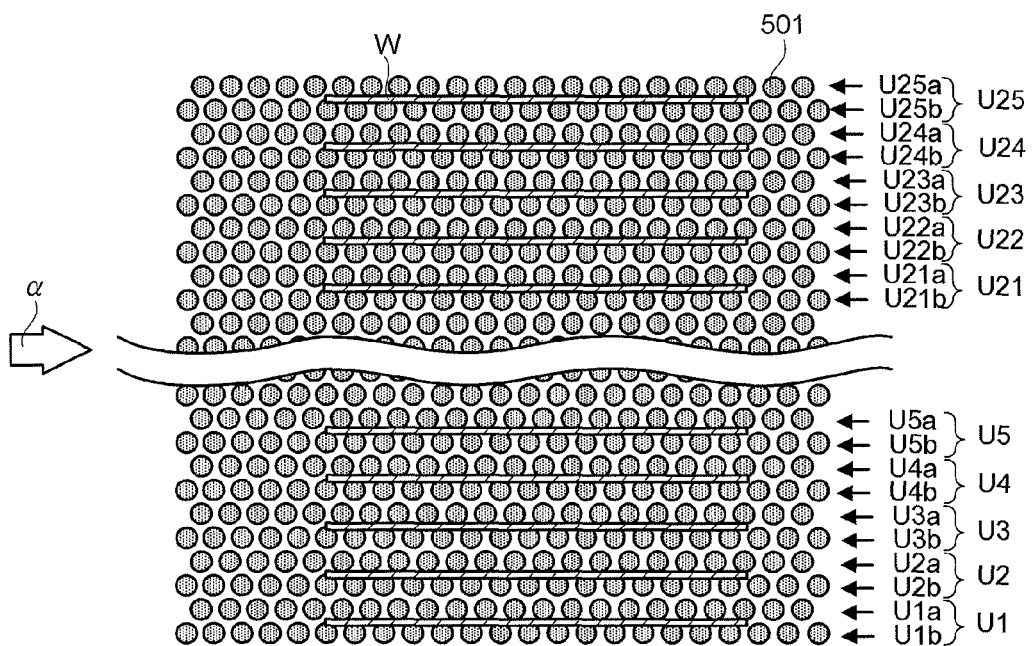

FIG. 4A and FIG. 4B are configuration charts of cleaning units disposed in the cleaning chamber 50. FIG. 4A is a plan view of the cleaning unit disposed in the cleaning chamber 50. FIG. 4B is a sectional view at a line I-I in FIG. 4A. Hereinafter, the cleaning unit is described with reference to FIG. 4A and FIG. 4B.

Cleaning units U1 to U25 are provided in the cleaning chamber 50. The number of cleaning units U1 to U25 is the same number of wafers W (25 wafers) cleaned at one time are provided in the cleaning chamber 50. Configurations of each cleaning unit U1 to U25 is the same. Hereinafter, the configuration of the cleaning unit U25 is described, and duplicated explanations are not given as for the configurations of the other cleaning units U1 to U24.

The cleaning unit U25 includes a sub unit U25a cleaning a front side of the wafer W, a sub unit U25b cleaning a back side of the wafer W, and supply nozzles 507a, 507b (not-illustrated) supplying a cleaning liquid to the sub units U25a, U25b. Hereinafter, configurations of the sub units U25a, U25b are described, but the configurations of the sub units U25a, U25b are the same. Hereinafter, the configuration of the sub unit U25a is described, and duplicated explanations are not given as for the configuration of the sub unit U25b.

The sub unit U25a includes each of plural roll brushes 501, motors 502, 503 rotating the roll brushes 501, and worm wheels 504 and worms 505 transmitting motive powers of the motors 502, 503 to the roll brushes 501.

Each roll brush 501 includes a brush body 501a being a sponge state porous body formed cylindrically and a core 501b inserted into the brush body 501a along a center axis of the brush body 501a. It is preferable that a Teflon (registered trademark) based material such as a PVA (polyvinyl alcohol), PP (polypropylene) is used for the brush body 501a. The worm wheel 504 is attached to one end of the core 501b, and the other end side of the core 501b is rotatably held by a casing of the cleaning chamber 50.

A length L of the brush body 501a is longer than a diameter D of the wafer W being a cleaning object. The brush body 501a is the sponge-state porous body. Accordingly, the brush body 501a is deformed in accordance with a shape of a bevel of the wafer W, and particles adhered to the bevel of the wafer W can be removed effectively.

A brush used for the cleaning of the wafer W is not limited to the sponge-state porous body. For example, a brush in which hair-bundles each made up of the Teflon-based material such as the PVA, the PP are implanted at an outer periphery of the core 501b may be used.

The worm wheels 504 are screwed to the worms 505 coupled to rotation shafts of the motors 502, 503 by couplers 506. The worms 505 coupled to the rotation shafts by the couplers 506 rotate when the rotation shafts of the motors 502, 503 rotate. When the worm 505 rotates, the worm wheel 504 screwed to the worm 505 rotates to rotate the roll brushes 501. It is possible to change rotation directions and rotation speeds of the roll brushes 501 by changing rotation directions and rotation speeds of the rotation shafts of the motors 502, 503.

As illustrated in FIG. 4A, the plural roll brushes 501 included by the sub unit U25a are alternately driven by the motor 502 or the motor 503. The motor 502 and the motor 503 each rotate the roll brushes 501 independently. Namely, in the present embodiment, it is possible to alternately change the rotation directions and the rotation speeds of the plural roll brushes 501 included by the sub unit U25a.

In the present embodiment, the motive powers of the motors 502, 503 are transmitted to the roll brushes 501 by the worm wheels 504 and the worms 505, but the other methods may be used. For example, the motive powers of the motors 502, 503 may be transmitted to the roll brushes 501 via a belt.

The supply nozzles 507a are provided at both sides of the sub unit U25a, and supply the cleaning liquid to the roll brushes 501 and the wafer W. In this embodiment, ammonium hydroxide, tetramethylammonium hydroxide, or an alkaline aqueous solution containing choline and so on is used as the cleaning liquid. The alkaline aqueous solution is used as the cleaning liquid, and thereby, it is possible to effectively suppress that the removed particles adhere to the wafer W again because the particles and the wafer W become the same electric potential.

Besides, the roll brushes 501 and the particles also become the same electric potential, and therefore, it is possible to suppress the adhesion of the particles to the roll brushes 501. It is enough for the cleaning liquid if the re-adhesion of the removed particles to the wafer W can be prevented, and pure water containing the other additives (for example, cationic surfactant, anionic surfactant, nonionic surfactant, and so on) may be used.

The cleaning liquid is supplied for a certain amount not only during the cleaning time of the wafer W but also constantly for an extent that the roll brushes 501 do not dry. The cleaning liquid may be supplied by passing the cleaning liquid through inside the core 501b of the roll brush 501 and soaking out of the brush body 501a instead of providing the supply nozzles 507a.

The drying chamber 60 dries plural wafers W at one time by supplying CDA (Clean Dry Air) or nitrogen gas ($N_2$ Gas) between the plural wafers W held by the transfer mechanism 20. At the waste water treatment chamber 70, neutralization of the cleaning liquid used at the cleaning chamber 50, removal of metal ions are performed.

(Operations of Cleaning Apparatus 1)

Figure 5:
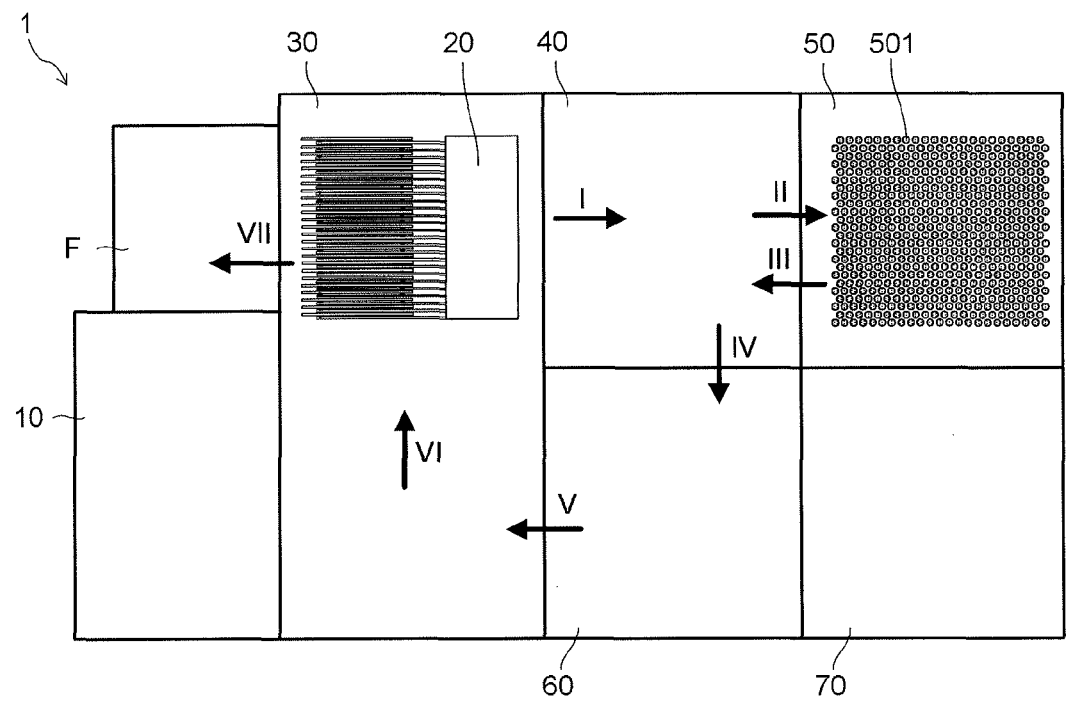
FIG. 5 is view illustrating a moving sequence of a wafer in the cleaning apparatus according to the first embodiment.

FIG. 5 is a view illustrating a moving sequence of the wafers W in the cleaning apparatus 1. FIG. 6A to FIG. 8B are explanatory diagrams as for the delivery and the cleaning of the wafers W at the cleaning chamber 50. FIG. 9A and FIG. 9B are explanatory diagrams as for the drying of the wafers W at the drying chamber 60. Hereinafter, operations of the cleaning apparatus 1 are described with reference to FIG. 5 to FIG. 9B. Numerals (I to VII) added to respective arrows in FIG. 5 represent a transfer sequence of the wafers W.

(Taking-Out of Wafers W)

An operator sets the container F housing the wafers W at the load port 10, then the lid of the container F is opened by the load port 10. The transfer mechanism 20 inserts the blades 201 at lower sides of the wafers W in the container F, and thereafter, places the wafers W on the rest pins 201a of the blades 201 by lifting the blades 201 up to a predetermined height. Next, the transfer mechanism 20 takes out the wafers W from the container F. The transfer mechanism 20 turns over for 180 degrees, and thereafter, moves to the second delivery chamber 40. The transfer mechanism 20 moves to the second delivery chamber 40, then delivers the wafers W to the cleaning chamber 50.

(Delivery of Wafers W to Cleaning Chamber 50)

FIG. 6A is the explanatory diagram of the delivery of the wafers W from the transfer mechanism 20 to the cleaning chamber 50. FIG. 6B is a partial enlarged view of FIG. 6A. As illustrated in FIG. 6A and FIG. 6B, the roll brushes 501 included by the sub units U1a to U25a provided at the front sides of the wafers W are rotated in a direction of arrows α (counterclockwise), and the roll brushes 501 included by the sub units U1b to U25b provided at the back sides of the wafers W are rotated in a direction of arrows β (clockwise) when the wafers W are delivered from the transfer mechanism 20 to the cleaning chamber 50.

Next, the transfer mechanism 20 inserts tip portions of the wafers W between the rotating roll brushes 501. The tip portions of the wafers W are held by the rotating roll brushes 501. The roll brushes 501 further rotate, then the wafers W move to a center of the cleaning chamber 50 by a friction with the roll brushes 501. A predetermined flow rate of cleaning liquid is supplied from the supply nozzles 507a, 507b.

(Cleaning of Wafers W at Cleaning Chamber 50)

FIG. 7A is the explanatory diagram of the cleaning of the wafers W at the cleaning chamber 50. FIG. 7B is a partial enlarged view of FIG. 7A. When the wafers W move to approximately the center of the cleaning chamber 50, the wafers W are cleaned by alternately rotating the roll brushes 501 included by each of the sub units U1a to U25a and U1b to U25b in the direction of arrows α (counterclockwise), and in the direction of arrows β (clockwise) as illustrated in FIG. 7A and FIG. 7B. The brushes 501 are alternately rotated in the different directions, and thereby, a friction force with the roll brushes 501 rotating in the direction of the arrows α (counterclockwise) and a friction force with the roll brushes 501 rotating in the direction of the arrows β (clockwise) negate with each other. Therefore, the wafer W is cleaned at approximately the same position.

It is preferable that the cleaning is performed while changing a cleaning surface of the wafer W by the roll brushes 501. Specifically, following step 1 and step 2 are alternately repeated to clean a whole surface of the wafer W by the roll brushes 501.

Step 1: The roll brushes 501 included by each of the sub units U1a to U25a and U1b to U25b are alternately rotated in the different directions to clean the wafers W.

Step 2: The roll brushes 501 included by the sub units U1a to U25a provided at the front sides of the wafers W are rotated in the counterclockwise direction, and the roll brushes 501 included by the sub units U1b to U25b provided at the back sides of the wafers W are rotated in the clockwise direction to change the cleaning surface by the roll brushes 501.

(Delivery of Wafers W to Transfer Mechanism 20)

Figure 8A:
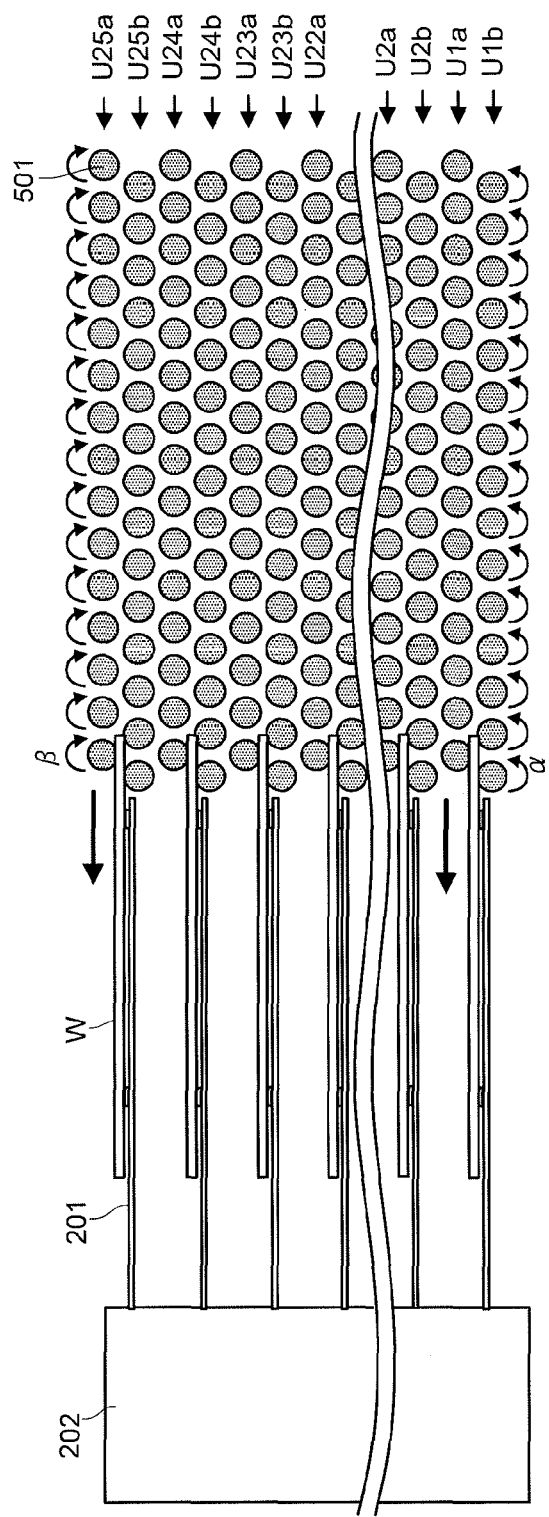
FIG. 8A and FIG. 8B are explanatory diagrams of delivery of the wafers of the cleaning apparatus according to the first embodiment.
Figure 8B:
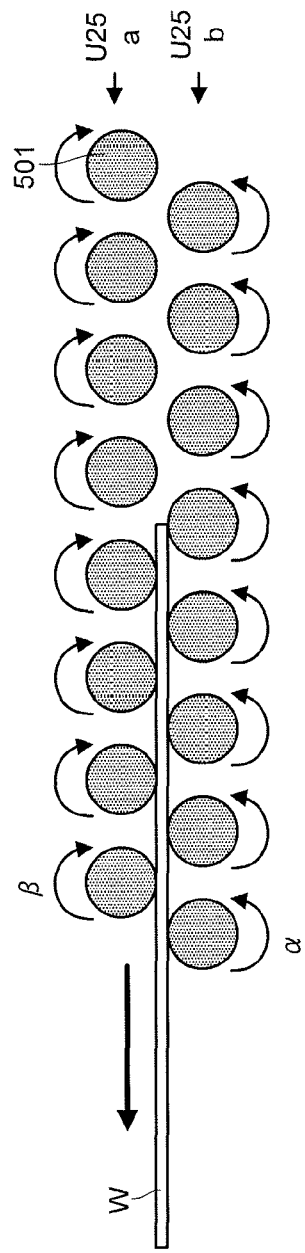
Figure 9A:
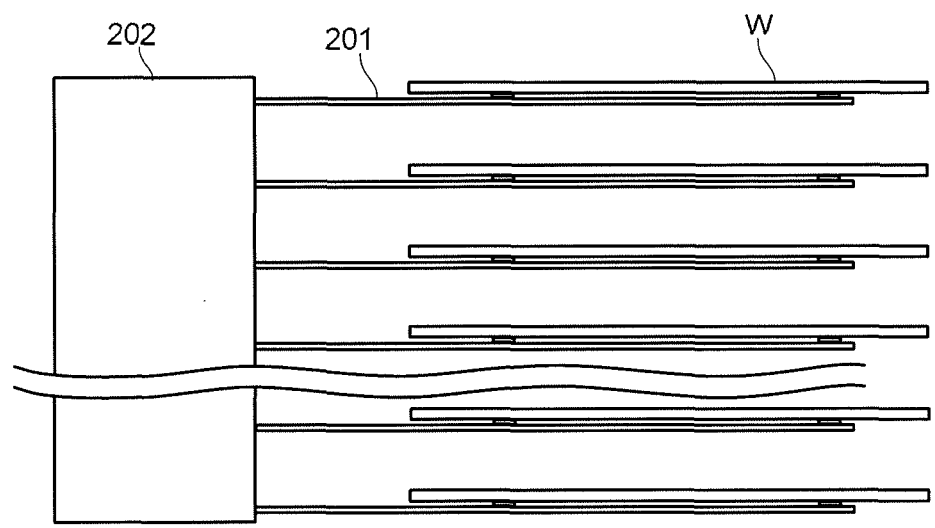
FIG. 9A and FIG. 9B are explanatory diagrams of drying of the wafers of the cleaning apparatus according to the first embodiment.
Figure 9B:
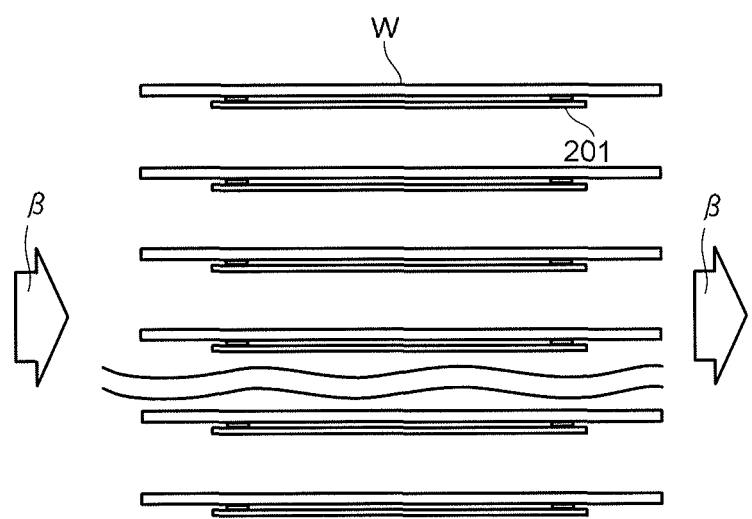

FIG. 8A is the explanatory diagram of the delivery of the wafers W from the cleaning chamber 50 to the transfer mechanism 20. FIG. 8B is a partial enlarged view of FIG. 8A. As illustrated in FIG. 8A and FIG. 8B, the roll brushes 501 included by the sub units U1a to U25a provided at the front sides of the wafers W are rotated in the direction of arrows β (clockwise), the roll brushes 501 included by the sub units U1b to U25b provided at the back sides of the wafers W are rotated in the direction of arrows α (counterclockwise) when the wafers W are delivered from the cleaning chamber 50 to the transfer mechanism 20. The wafers W move from the center of the cleaning chamber 50 to a left direction by the friction with the roll brushes 501, and placed on the rest pins 201a of the blades 201 of the transfer mechanism 20.

(Drying of Wafers W)

FIG. 9A and FIG. 9B are the explanatory diagrams as for the drying of the wafers W at the drying chamber 60. FIG. 9A is a left side view of the transfer mechanism 20 in the drying chamber 60. FIG. 9B is a front view of the transfer mechanism 20 in the drying chamber 60. Arrows β in FIG. 9B represent a supplying direction of the CDA or the nitrogen gas.

When the wafers W are delivered from the cleaning chamber 50 to the transfer mechanism 20, the transfer mechanism 20 moves from the second delivery chamber 40 to the drying chamber 60. At the drying chamber 60, the CDA or the nitrogen gas is supplied for a certain period of time to the respective wafers W placed on the rest pins 201a of the blades 201 of the transfer mechanism 20. The wafers W are dried by the supplying of the CDA or the nitrogen gas. The wafers W are placed on the rest pins 201a, and therefore, the back sides of the wafers W are also dried.

(Housing of Wafers W)

After the wafers W are dried, the transfer mechanism 20 moves from the drying chamber 60 to the first delivery chamber 30. The transfer mechanism 20 houses the wafers W placed on the blades 201 into the container F via an opposite procedure from the one when the wafers W are taken out of the container F. After that, the lid of the container F is closed by the load port 10, and the cleaning of the wafers W is completed.

As stated above, the cleaning apparatus 1 according to the first embodiment is constituted such that the 25 wafers W are transferred by the transfer mechanism 20 at one time, and are cleaned by the roll brushes provided in plural by each front side and back side of the wafers W in which longitudinal directions thereof are oriented in parallel relative to the front sides and the back sides of the wafers W at one time. Further, transfer mechanisms to deliver the wafers W between the transfer mechanism 20 and the cleaning chamber 50, and between the transfer mechanism 20 and the drying chamber 60 are not necessary. Accordingly, a time required for the delivery of the wafers W is reduced. As a result, it is possible to effectively shorten a TAT (Turn Around Time) required for the cleaning of the wafers W, and the number of processing wafers per unit time (throughput) of the cleaning apparatus 1 is improved.

Ammonium hydroxide, tetramethylammonium hydroxide, or the alkaline aqueous solution containing choline and so on is used as the cleaning liquid. Accordingly, it is possible to effectively suppress that the particles removed from the wafers W adhere to the wafers W again.

Second Embodiment

Figure 10A:
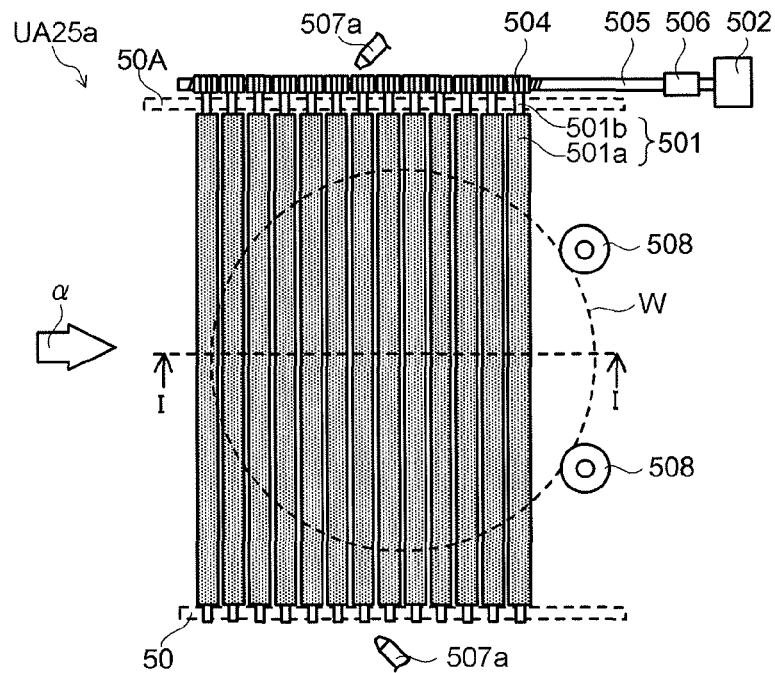
FIG. 10A and FIG. 10B are configuration charts of cleaning units according to a second embodiment.
Figure 10B:
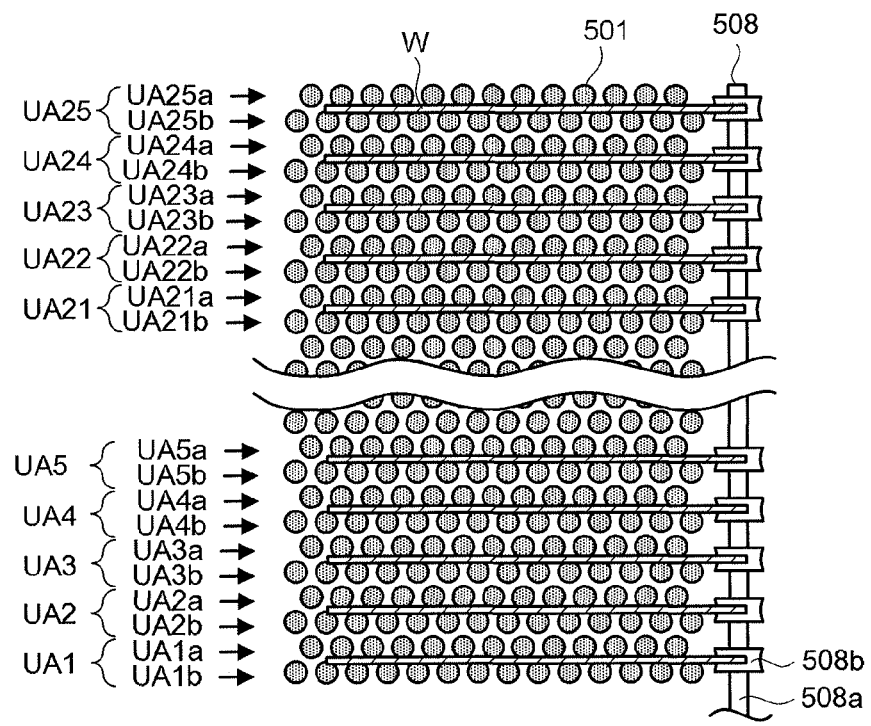

FIG. 10A and FIG. 10B are configuration charts of cleaning units UA1 to UA25 disposed in a cleaning chamber 50A of a cleaning apparatus 2 according to a second embodiment (hereinafter, described as the cleaning apparatus 2). FIG. 10A is a plan view of the cleaning units UA1 to UA25 disposed in the cleaning chamber 50A. FIG. 10B is a sectional view at a line I-I in FIG. 10A.

Hereinafter, configurations of the cleaning units UA1 to UA25 disposed in the cleaning chamber 50A are described with reference to FIG. 10A and FIG. 10B. The configuration included by the cleaning apparatus 2 other than the cleaning chamber 50A is the same as the configuration of the cleaning apparatus 1 described with reference to FIG. 1A to FIG. 3B, and therefore, duplicated descriptions are not given. The same reference numerals are added to the same configuration as the configuration of the cleaning apparatus 1 described with reference to FIG. 1A to FIG. 3B, and duplicated descriptions are not given.

(Configuration in Cleaning Chamber 50A)

The same number of cleaning units UA1 to UA25 as the number of wafers W (25 wafers) cleaned at one time, and two rotation mechanisms 508 rotating the wafers W are provided in the cleaning chamber 50A. The configurations of each cleaning units UA1 to UA25 is the same. Hereinafter, the configuration of the cleaning unit UA25 is described, and duplicated descriptions are not given as for the configurations of the other cleaning units UA1 to UA24.

The cleaning unit UA25 includes a sub unit UA25a cleaning a front side of the wafer W, a sub unit UA25b cleaning a back side of the wafer W, and the supply nozzles 507s, 507b (not-illustrated) supplying the cleaning liquid to the sub units UA25a, UA25b. Hereinafter, configurations of the sub units UA25a, UA25b are described, but the configurations of the sub units UA25a, UA25b are the same. Hereinafter, the configuration of the sub unit UA25a is therefore described, and duplicated descriptions are not given as for the configuration of the sub unit UA25b.

The subunit UA25a includes each of the plural roll brushes 501 cleaning surface of the wafer W, the motor 502 rotating the roll brushes 501, and the worm wheel 504 and the worm 505 transmitting the motive power of the motor 502 to the roll brushes 501.

The worm wheel 504 is attached to one end of each roll brush 501. The other end side of each roll brush 501 is rotatably held by the casing of the cleaning chamber 50A. Each roll brush 501 rotates by the motive power of the motor 502 transmitted via the worm wheel 504 and the worm 505.

The rotation mechanism 508 includes a rotation shaft 508a connected to a motor (not-illustrated) and 25 pieces of rotation bodies 508b attached to the rotation shaft 508a. Each rotation body 508b rotates together with a rotation of the rotation shaft 508a. A sponge state porous body of which material is the Teflon-based material such as the PVA (polyvinyl alcohol) and PP (polypropylene) is attached at an outer peripheral surface of each rotation body 508b, and the bevel of the wafer W is cleaned by the porous body.

(Delivery of Wafers W to Cleaning Chamber 50A)

FIG. 11A is an explanatory diagram of the delivery of the wafers W from the transfer mechanism 20 to the cleaning chamber 50A. FIG. 11B is a partial enlarged view of FIG. 11A. As illustrated in FIG. 11A and FIG. 11B, the roll brushes 501 included by the sub units UA1a to UA25a provided at the front sides of the wafers W are rotated in a direction of arrows α (counterclockwise), and the roll brushes 501 included by the sub units UA1b to UA25b provided at the back sides of the wafers W are rotated in a direction of arrows β (clockwise) when the wafers W are delivered from the transfer mechanism 20 to the cleaning chamber 50A.

Next, the transfer mechanism 20 inserts tip portions of the wafers W between the rotating roll brushes 501. The tip portions of the wafers W are held by the rotating roll brushes 501. The roll brushes 501 further rotate, then the wafers W move in a right direction in FIG. 11A and FIG. 11B by a friction with the roll brushes 501. A predetermined flow rate of cleaning liquid is supplied from the supply nozzles 507a, 507b, and the rotation shaft 508a of the rotation mechanism 508 is rotated by a motor (not-illustrated).

(Cleaning of Wafers W at Cleaning Chamber 50A)

Figure 12A:
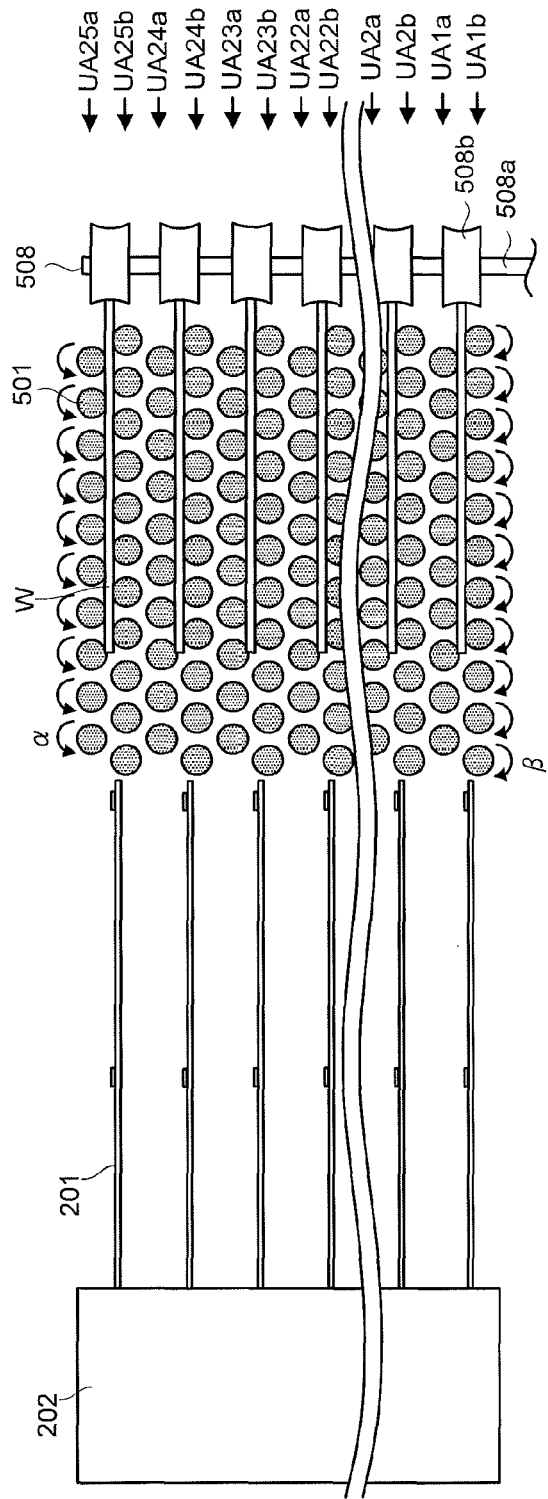
FIG. 12A and FIG. 12B are explanatory diagrams of cleaning of the wafers of the cleaning apparatus according to the second embodiment.
Figure 12B:
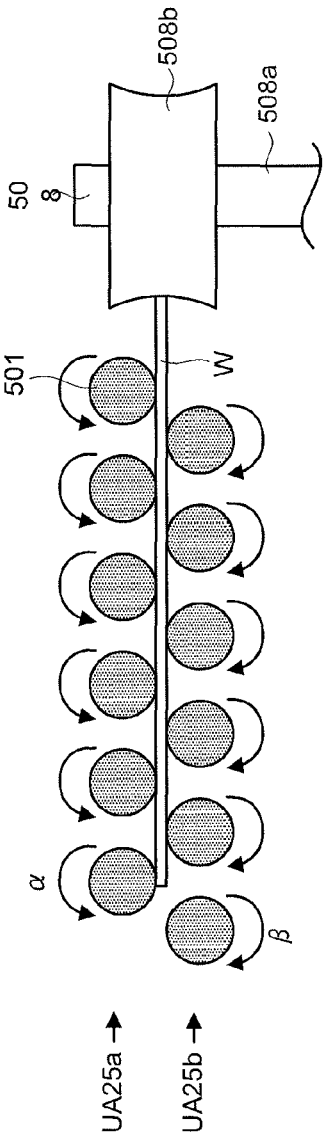

FIG. 12A is an explanatory diagram of the cleaning of the wafers W at the cleaning chamber 50A. FIG. 12B is a partial enlarged view of FIG. 12A. The wafer W moves to a position to be in contact with the rotation body 508b by the rotation of the roll brushes 501. The wafer W rotates by a friction with the rotation body 508b. In this embodiment, the wafers W are cleaned for a predetermined time (for example, for five minutes) under a state in which the roll brushes 501 included by the sub units UA1a to UA25a provided at the front sides of the wafers W are rotated in the direction of arrows α (counterclockwise), and the roll brushes 501 included by the sub units UA1b to UA25b provided at the back sides of the wafers W are rotated in the direction of arrows β (clockwise).

(Delivery of Wafers W to Transfer Mechanism 20)

Figure 13A:
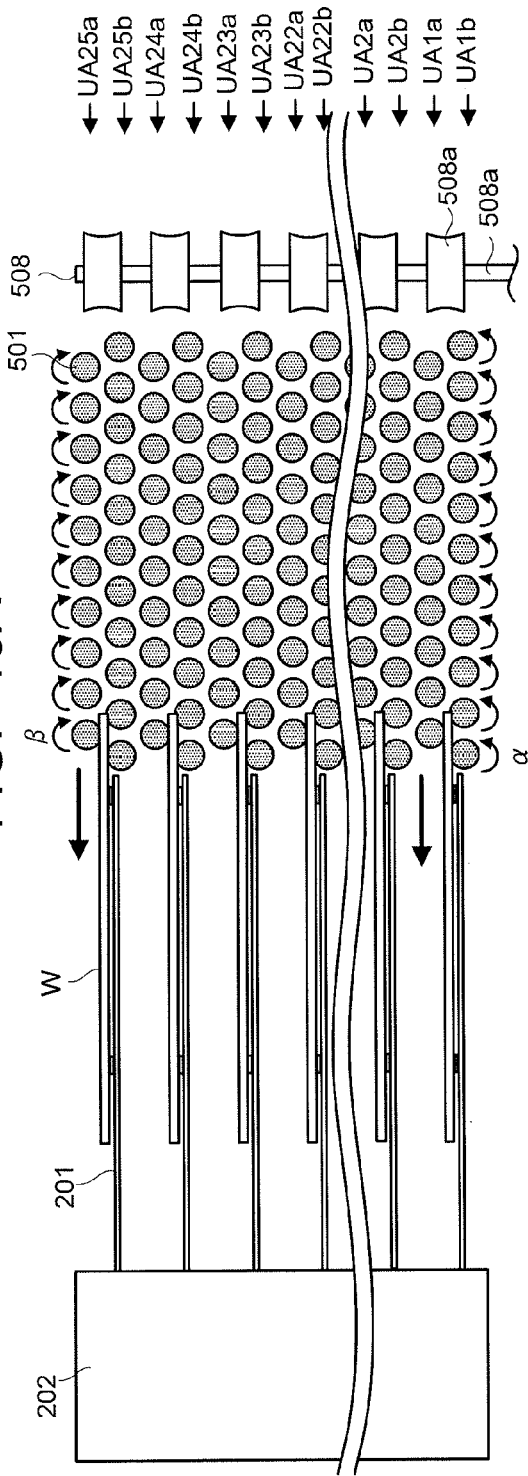
FIG. 13A and FIG. 13B are explanatory diagrams of delivery of the wafers of the cleaning apparatus according to the second embodiment.
Figure 13B:
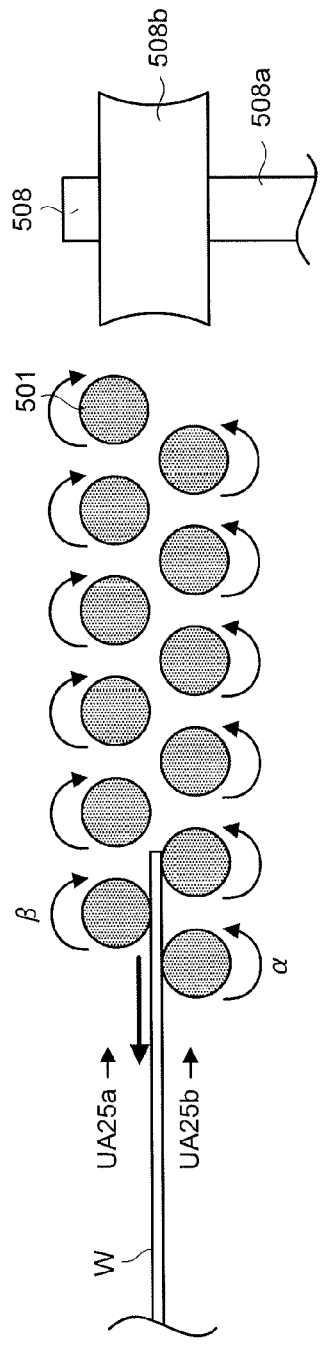

FIG. 13A is an explanatory diagram of the delivery of the wafers W from the cleaning chamber 50A to the transfer mechanism 20. FIG. 13B is a partial enlarged view of FIG. 13A. As illustrated in FIG. 13A and FIG. 13B, the roll brushes 501 included by the sub units UA1a to UA25a provided at the front sides of the wafers W are rotated in the direction of arrows β (clockwise), the roll brushes 501 included by the sub units UA1b to UA25b provided at the back sides of the wafers W are rotated in the direction of arrows α (counterclockwise) when the wafers W are delivered from the cleaning chamber 50A to the transfer mechanism 20. The wafers W move in a left direction of the FIG. 13A and FIG. 133 by a friction with the roll brushes 501, and placed on the rest pins 201a of the blades 201 of the transfer mechanism 20.

The other operations are the same as the operations of the cleaning apparatus 1 described with reference to FIG. 5 to FIG. 9B, and therefore, duplicated descriptions are not given. As stated above, the cleaning apparatus 2 includes the rotation mechanisms 508 cleaning the bevels of the wafers W being the cleaning objects, and therefore, the particles adhered to the bevels of the wafers W are able to be removed more effectively. The other effects are the same as the effects of the cleaning apparatus 1.

EXAMPLES

The inventors examine as for cleaning performance when the alkaline aqueous solution is used as the cleaning liquid. Specifically, the numbers of particles are examined before and after the cleaning as for a case when a mixed liquid in which choline is contained for 0.01 wt % into pure wafer is used as the cleaning liquid (example) and a case when only the pure wafer is used as the cleaning liquid (comparative example). A silicon bare wafer of which diameter is 300 mm is used as the wafer. Cleaning conditions other than the cleaning liquid are the same.

Results of the example and the comparative example are represented in Table 1. The particles are measured only at a front side of the wafer where a semiconductor device is formed.

TABLE 1

|  | Example | Comparative Example |
|---|---|---|
| Cleaning Liquid | Alkaline Aqueous Solution | Pure Water |
| Number of particles 100 nm or more | 0 | 41 |
| Number of particles 38 nm or more | 80 | 2381 |

It can be seen from the results represented in Table 1 that the increasing number of particles before and after the cleaning is very small when the alkaline aqueous solution is used as the cleaning liquid, and a good result can be obtained. The number of particles after the cleaning increases more than the number of particles before the cleaning in the results represented in Table 1. This is because a wafer to which scarcely any particle adheres of which cleanliness is high and is used. A reason why the number of particles increases after the cleaning is because the particles adhered to the brushes adhere to the wafer again. It can be seen that it is possible to very effectively suppress that the particles adhered to the brushes adhere to the wafer again when the alkaline aqueous solution is used as the cleaning liquid from the above.

In the cleaning apparatuses 1, 2 according to the first and second embodiments, the embodiments in which 25 wafers W are cleaned at one time are described. This is to correspond to a process in which 25 wafers W are normally processed as one Lot when a semiconductor device is manufactured. However, it is not necessarily required to clean the 25 wafers W at one time in an actual cleaning. For example, the 25 wafers W may be cleaned by separating into plural pieces (13 pieces and 12 pieces). Plural pieces of load ports are included, and the plural lots of wafers W (for example 50 wafers) may be cleaned at one time.

Figure 14A:
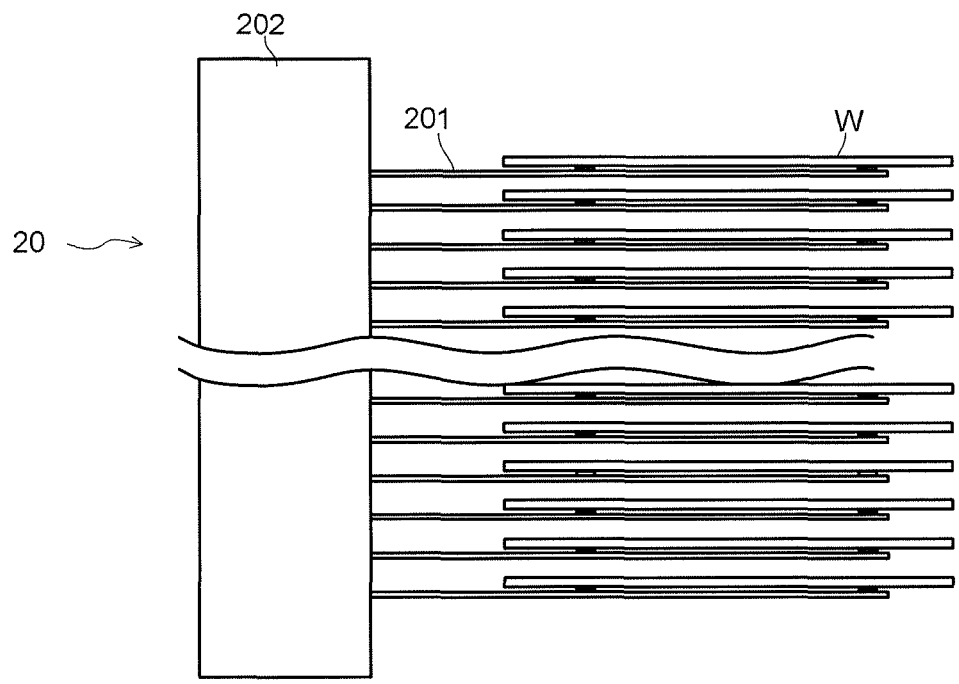
FIG. 14A and FIG. 14B are configuration charts of a transfer mechanism according to the other embodiment.
Figure 14B:
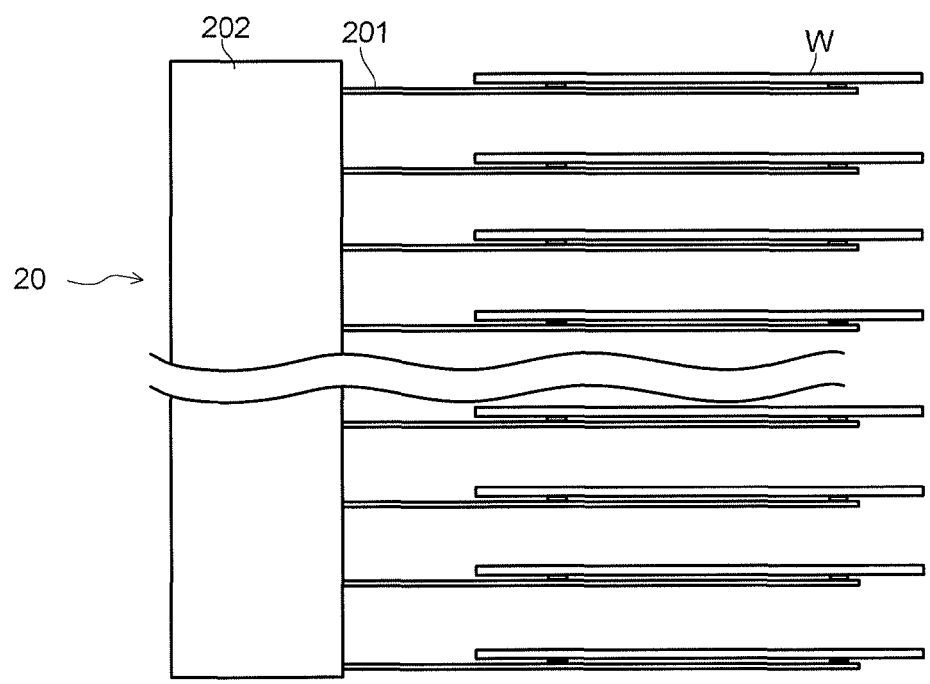

As illustrated in FIG. 14A and FIG. 14B, the transfer mechanism 20 is constituted to be expandable and contractable in a vertical direction, the wafers W may be delivered with the container F under a state of FIG. 14A, and the wafers W may be delivered with the cleaning chamber 50 or the cleaning chamber 50A under a state of FIG. 14B, namely a state in which the transfer mechanism 20 is expanded in the vertical direction. An air cylinder, a ball screw, and so on may be used for the expansion and contraction. It is thereby possible to clean the wafers W under a state in which clearances (gaps) between the wafers W are expanded, and therefore, a layout (disposition) of the cleaning unit may have additional coverage by constituting as stated above.

Other Embodiments

While certain embodiments have been described, these embodiments have been presented by way of example only, and are not intended to limit the scope of the inventions. Indeed, the novel embodiments described herein may be embodied in a variety of other forms; furthermore, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A cleaning apparatus, comprising:
   a transfer unit transferring plural semiconductor substrates under a state, the plural semiconductor substrates being held with predetermined intervals;
   roll brushes provided in plural pieces by each front side and back side of the plural semiconductor substrates, longitudinal directions of the roll brushes being oriented in parallel relative to the front side and the back side; and
   a driving unit rotating the plural roll brushes provided by each front side and back side.

2. The apparatus according to claim 1, further comprising rotation bodies rotating under a state being in contact with bevel parts of the plural semiconductor substrates and cleaning the bevel parts.

3. The apparatus according to claim 1, further comprising a supply unit supplying pure water containing additives suppressing adhesion of particles to the semiconductor substrate.

4. The apparatus according to claim 3,
   wherein the pure water containing the additives is an alkaline aqueous solution.

5. The apparatus according to claim 1,
   wherein the transfer unit is expandable and contractable in a vertical direction relative to principle surfaces of the plural semiconductor substrates.

6. The apparatus according to claim 1,
   wherein the transfer unit includes:
      plural blades placing the plural semiconductor substrates thereon;
      a supporting member supporting the plural blades; and
      a driving mechanism coupled to the supporting member.

7. The apparatus according to claim 6,
   wherein the plural blades each include plural pieces of rest pins.

8. The apparatus according to claim 1, further comprising:
   a motor; and
   a transmitting unit transmitting rotation of the motor to the roll brushes.

9. The apparatus according to claim 8,
   wherein the transmitting unit includes a worm and a worm wheel.

10. The apparatus according to claim 1,
   wherein the roll brush includes:
      a brush body being a sponge state porous body formed cylindrically; and
      a core inserted into the brush body along a center axis of the brush body.

11. The apparatus according to claim 10,
   wherein a length of the brush body is longer than a diameter of the semiconductor substrate.

12. The apparatus according to claim 1, further comprising a drying unit drying the plural semiconductor substrates after cleaning.

13. The apparatus according to claim 12,
   wherein the drying unit supplies clean dry air or nitrogen gas to the plural semiconductor substrates.

* * * * *